United States Patent
Won et al.

(10) Patent No.: US 10,153,417 B2
(45) Date of Patent: Dec. 11, 2018

(54) HEAT CONVERSION DEVICE

(71) Applicant: LG INNOTEK CO., LTD., Seoul (KR)

(72) Inventors: Boone Won, Seoul (KR); Jong Bae Shin, Seoul (KR); Jong Min Lee, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 73 days.

(21) Appl. No.: 14/884,295

(22) Filed: Oct. 15, 2015

(65) Prior Publication Data

US 2016/0111621 A1 Apr. 21, 2016

(30) Foreign Application Priority Data

Oct. 15, 2014 (KR) ........................ 10-2014-0139090

(51) Int. Cl.
*H01L 35/30* (2006.01)
*H01L 35/00* (2006.01)
*F25B 21/02* (2006.01)
*H01L 35/32* (2006.01)
*F02G 1/043* (2006.01)

(52) U.S. Cl.
CPC .............. *H01L 35/30* (2013.01); *F25B 21/02* (2013.01); *H01L 35/00* (2013.01); *H01L 35/32* (2013.01); *F02G 1/043* (2013.01); *F25B 2321/025* (2013.01)

(58) Field of Classification Search
CPC .......... H01L 31/30–31/32; H01L 35/30; H01L 35/32; F02G 1/043; F25B 21/02; F25B 21/04; F25B 2321/025
See application file for complete search history.

(56) References Cited

U.S. PATENT DOCUMENTS

| | | | | |
|---|---|---|---|---|
| 3,688,800 A | * | 9/1972 | Hayner | ..................... F15D 1/02 137/625.3 |
| 2006/0137361 A1 | | 6/2006 | Ghoshal | |
| 2008/0245398 A1 | * | 10/2008 | Bell | ........................ F02G 1/043 136/224 |

FOREIGN PATENT DOCUMENTS

| WO | WO-2004/094317 A2 | 11/2004 |
|---|---|---|
| WO | WO-2004/094317 A3 | 11/2004 |

OTHER PUBLICATIONS

European Search Report dated Mar. 22, 2016 in European Application No. 15189855.8.

* cited by examiner

*Primary Examiner* — Jeffrey T Barton
*Assistant Examiner* — Michael Y Sun
(74) *Attorney, Agent, or Firm* — Saliwanchik, Lloyd & Eisenschenk

(57) ABSTRACT

Provided is a heat conversion device, including: a housing; a thermoelectric module received in the housing and including a thermoelectric semiconductor between substrates disposed to face each other; a first temperature conversion portion and a second temperature conversion portion disposed between the substrates, respectively; and a heat reduction portion adopted to guide a part of a fluid flowing in the housing and passing through the first temperature conversion portion to the second temperature conversion portion.

10 Claims, 7 Drawing Sheets

HEAT CONVERSION DEVICE

CROSS-REFERENCE TO RELATED APPLICATION

This application claims the benefit under 35 U.S.C. § 119 to Korean Application No. 10-2014-0139090 filed Oct. 15, 2014, which is hereby incorporated by reference in its entirety.

BACKGROUND

Field of the Invention

Embodiments of the present invention relate to a technique for increasing the efficiency of a heat conversion device using a thermoelectric element.

Description of the Related Arts

In general, a thermoelectric element including a thermoelectric device has a structure in which a PN junction pair is formed by bonding a p-type thermoelectric material and an n-type thermoelectric material between metal electrodes. When a temperature difference is provided between the materials of this PN junction pair, electric power is generated by the Seebeck effect so that a thermoelectric element can serve as a power generating device. Also, the thermoelectric element may be used as a temperature controlling device by the Peltier effect in which one material of the PN junction pair is cooled and the other material is heated.

In particular, the temperature controlling device using the thermoelectric conversion element implements a cooling or heating operation by passing an external inflow medium through a heat absorption surface and a heat emitting surface.

However, since a temperature differential ΔT between a heat absorption portion of the thermoelectric conversion device from which heat absorption is generated, and a heat emitting portion from which heat emission is generated is fixed at a given applied voltage, it causes a limit in a cooling and heating temperature due to an influence on an outdoor air temperature. That is, due to the limit caused by the temperature differential generated between the heat absorption portion and the heat emitting portion, it is problematic in that it is difficult to implement thermoelectric efficiency beyond a fixed temperature differential.

BRIEF SUMMARY

An aspect of embodiments of the present invention may provide a heat conversion device capable of largely increasing heat conversion efficiency by moving a part of a fluid passing through the heat conversion device using a thermoelectric element to a heat absorption side or a heat emitting side so that a temperature differential between a heat absorption portion and a heat emitting portion can be maximized.

According to an aspect of the embodiments of the present invention, a heat conversion device may include: a housing; a thermoelectric module received in the housing and including a thermoelectric semiconductor between substrates disposed to face each other; a first temperature conversion portion and a second temperature conversion portion disposed on the substrates, respectively; and a heat reduction portion received in the housing and adopted to guide a part of a fluid passing through the first temperature conversion portion to the second temperature conversion portion.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
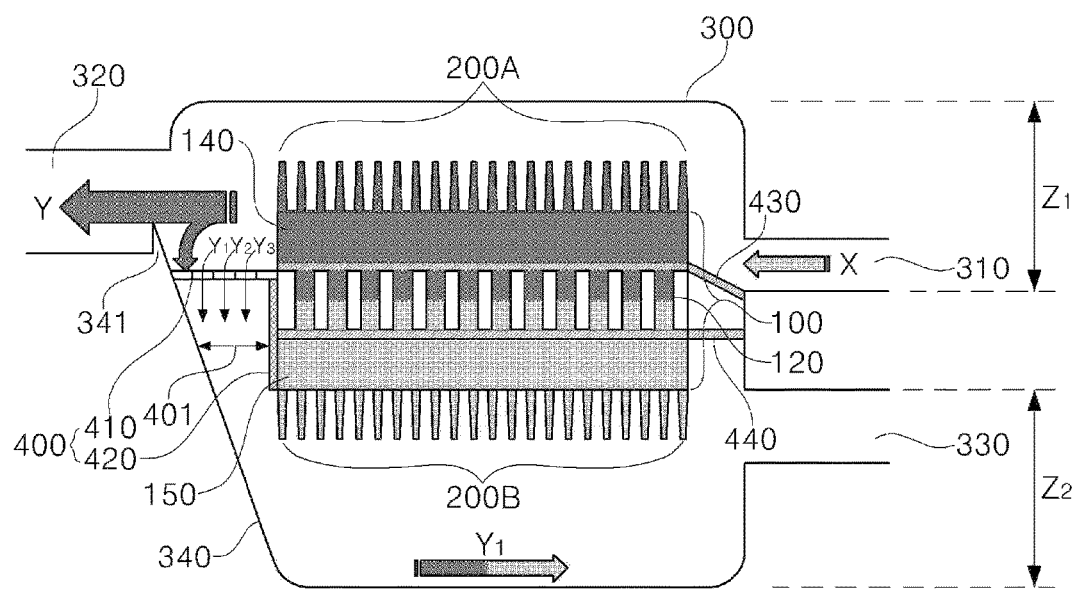
FIG. 1 is a conceptual view illustrating the main portions of a heat conversion device according to an embodiment of the present invention.

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element. Furthermore, the elements having the similar functions and operations of the drawings are given the same reference numerals. As used herein, the singular forms are intended to include the plural forms as well, unless the context clearly indicates otherwise.

FIG. 1 is a conceptual view illustrating the main portions of a heat conversion device according to an embodiment of the present invention.

Referring to FIG. 1, a heat conversion device according to an embodiment of the present invention may include: a thermoelectric module 100 including a thermoelectric semiconductor 120 between substrates (140, 150) disposed to face each other; a first temperature conversion portion 200A and a second temperature conversion portion 200B disposed on the substrates, respectively; and a heat reduction portion 400 adopted to partially guide a fluid passing through the first temperature conversion portion 200A to the second temperature conversion portion 200B.

In particular, in the aforesaid structure, the thermoelectric module 100 is configured such that the first temperature conversion portion 200A and the second temperature conversion portion 200B are disposed in a region that implements the function of a heat absorption portion or a heat emitting portion, thereby enabling cooling or heating by moving a fluid such as air, a liquid, or the like to the first temperature conversion portion 200A and the second temperature conversion portion 200B. In this case, the thermoelectric module moves a part of the fluid passing through one of the first temperature conversion portion 200A and the second temperature conversion portion 200B toward another one, thereby functioning to further increase or reduce a temperature of the temperature conversion portion in the movement direction so that the scope of a regularly determined temperature differential between thermoelectric elements, can be adjusted. As such, as the scope of the determined temperature differential is adjusted, in the case of cooling, a cooling temperature may be implemented as a lower temperature. Of course, in the case where heating is needed, a heating temperature may be implemented as a higher temperature.

Specifically, the heat conversion device according to the embodiment of the present invention entirely includes a housing 300 adopted to receive the heat conversion module 100 in an inner part; an injection portion 310 and a discharging portion 320 adopted to enable the entry of a fluid such as air, a liquid or the like inside the housing; and an outlet portion 330 adopted to partially circulate and discharge the fluid.

Figure 7:
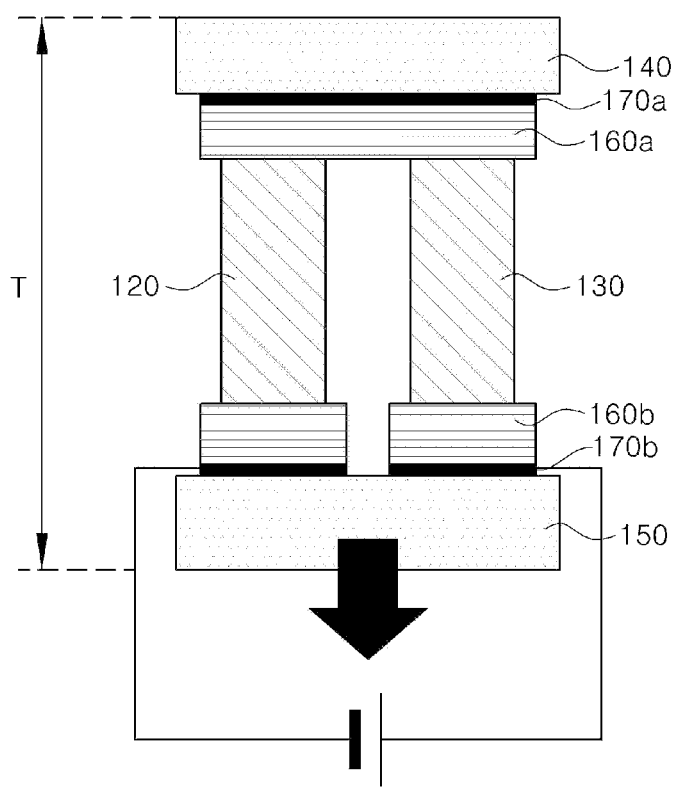
FIGS. 7 and 8 are conceptual views illustrating main portions intended for explaining the structure of a thermoelectric module.
Figure 8:
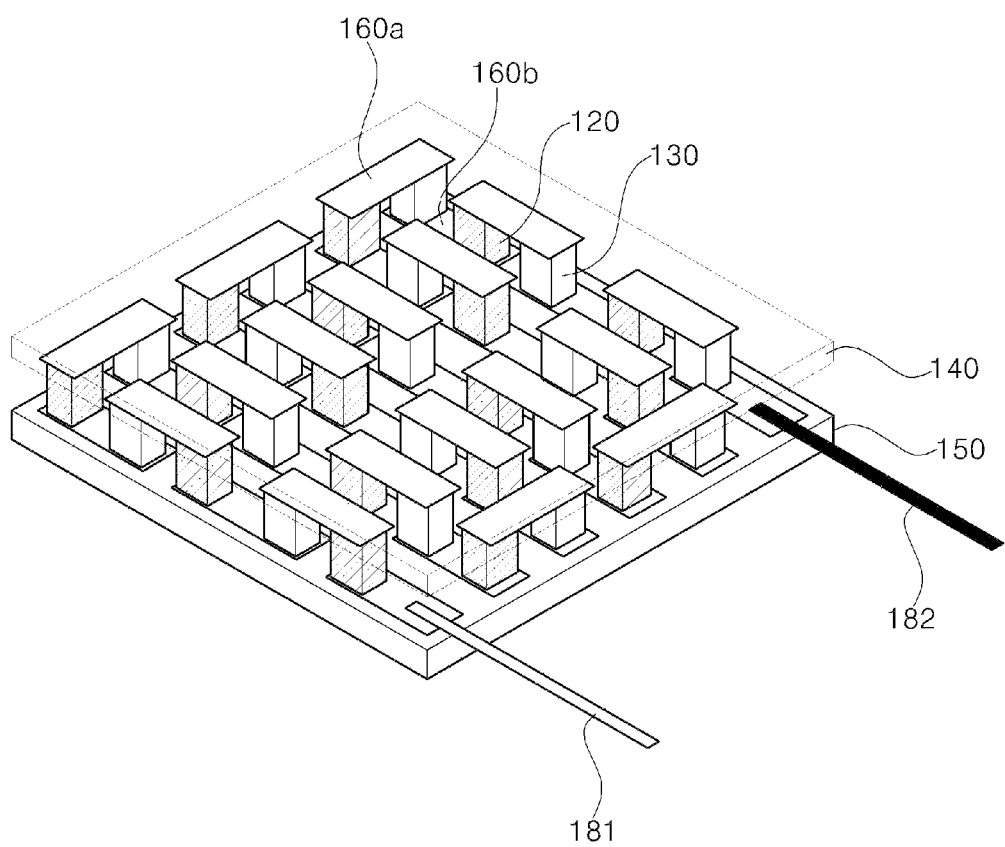

In particular, the thermoelectric module 100 is received inside the housing 300, and is configured to include at least one unit module having a structure in which a thermoelectric semiconductor element is mounted to a gap between a pair of substrates 140, 150 (see FIGS. 7 and 8). In particular, in this case, the thermoelectric module 100 is provided such that a heat transfer member such as a heat sink for efficiently transmitting and implementing a change of heat emitting or heat absorption generated from the surfaces of the substrates 140, 150 is adjacent to an upper part of the thermoelectric module 100, thereby constituting the temperature conversion portions adopted to convert a temperature by coming into contact with the fluid.

In the embodiment of the present invention shown in FIG. 1, the structure in which the first temperature conversion portion 200A is disposed at an upper part of the thermoelectric module, and the second temperature conversion portion 200B is disposed at a lower part of the thermoelectric module is described as an example. Of course, the arrangement structure may be changed in reverse.

When the fluid (the fluid will be hereinafter described based on air as an example) such as air, a liquid (heat transfer medium) or the like flows through the injection portion 310 from the outside of the housing (see X of FIG. 1), the fluid travels via the first temperature conversion portion 200A. In this case, a temperature of the fluid is increased up to the extent of efficiency caused by a fixed temperature differential $\Delta T$ defined in a heat absorption portion and a heat emitting portion of the thermoelectric module 100.

As one example, in a case where a fluid flows inside the housing, if a temperature of the fluid is 15° C., a temperature differential $\Delta T$ is 30° C., a temperature of the heat absorption portion is 10° C., and the fluid having the temperature of 15° C. has maximum efficiency to the extent corresponding to the predetermined temperature differential 30° C. of the thermoelectric module, the temperature of the fluid is increased by 45° C. unless energy is separately supplied from the outside.

In the aforesaid structure, the fluid passing through the first temperature conversion portion 200A is discharged in a state of having the increased temperature by passing through the discharging portion 320 so that a warm current of air (when the fluid is air) can be discharged. In this case, a part Y1 of the discharged air Y is introduced to the second temperature conversion portion 200B by passing through a reduction flow passage 401 via the heat reduction portion 400. That is, when a part of the discharged air having the temperature, which is increased to some degree, is transmitted to the second temperature conversion portion 200B from which a heat absorption reaction is generated, a temperature of the second temperature conversion portion 200B causes a desired effect in some degree.

That is, in the aforesaid example, if the temperature of the fluid is 15° C. upon flowing, the temperature differential $\Delta T$ is 30° C., the temperature of the heat absorption portion is 10° C., and the fluid having the temperature of 15° C. has maximum efficiency to the extent corresponding to the predetermined temperature differential 30° C. of the thermoelectric module, the temperature of the fluid is increased by 45° C. unless energy is separately supplied from the outside. In such a case, when the temperature of reduction air Y1 branched from the discharged air Y corresponding to 45° C. increases the fixed temperature of 10° C. of the heat absorption portion to some extent, and thus changes the temperature to the extent of 20° C., a temperature of the heat emitting portion, which can be maximally increased, is increased by 50° C. due to the basic standard of the temperature differential, $\Delta T=30°$ C.

As the result described above, in consideration of the fact that the range of the predetermined temperature differential (thermoelectric efficiency) of the thermoelectric module itself is fixed, the temperature of any one of the heat absorption portion and the heat emitting portion is increased using a part of air passing through another one so that a heating temperature or a cooling temperature of a desired device (a heater or a cooler) can be largely increased or reduced.

The heat reduction portion 400 according to the embodiment of the present invention provided for this is implemented to branch a part of the flow passage of the fluid passing through the first temperature conversion portion 200A by basically changing a structure of the housing, and is configured to guide the branched fluid to the second temperature conversion portion 200B by forming the reduction flow passage 401 for enabling movement of the fluid.

This structure includes one or more portions 410, 420, 430, 440 adopted to divide an inner part of the housing into a first region Z1 formed to communicate with the first temperature conversion portion and a second region Z2 formed to communicate with the second temperature conversion portion. Thus, a desired heat emitting reaction occurs in the first region, and the air through the heat emitting reaction is partially circulated to the second region so that the temperature of the heat absorption portion can be increased (of course, in the case of a cooler, as a reverse arrangement, the air passing through the heat absorption portion may be branched and may be moved to the heat emitting portion).

In particular, in the structure illustrated in FIG. 1, as one example, portions of the first region and the second region are realized using a separate member. However, this is only one example, and the first region and the second region may be implemented in an integral structure (see FIG. 2) by changing the arrangement structure of the housing and the thermoelectric module.

In the structure illustrated in FIG. 1, it is preferable to provide at least one of the portions as a control portion 410 for enabling control of an amount of the fluid flowing in the reduction flow passage 401. The control portion 410 may change the amount of a part (Y1~Y3) of the discharged air (Y) passing through the first temperature conversion portion 200A flowing in the reduction flow passage 401 according to setting or circumstances. As one example, the control portion is formed as a plate-like structure having communication holes, and the number of the communication holes or a width of the hole may be manually or automatically adjusted so that the amount of flow air can be controlled. Thus, control of the temperature may be more accurately implemented.

Also, the reduction flow passage 401 is implemented as an inclined wall 340 with an inclination at one side of the housing 300 so that movement of the fluid can be easily realized. Of course, in the illustrated structure, by changing the structure of the housing, the flow passage reaching the second temperature conversion portion is designed to have a width that reduces gradually toward a lower part so that movement of the fluid can be easily implemented and the fluid can be prevented from flowing backward. However, unlike this, as an independent pipe or a flow pipe is installed, the reduction flow passage may be implemented in a structure for more efficiently controlling movement of the fluid.

Moreover, in order to efficiently branch a part of the discharged air Y in the embodiment of the present invention, a branching pattern portion 341 is installed at an adjacent portion of a discharging pipe so that a flow direction of the air can be partially easily changed by friction. That is, the branched pattern portion 341 may be provided at the entrance of a discharging portion, from which the fluid passing through the first temperature conversion portion is discharged, to have a protruding structure, and the branched pattern portion may include a branched pattern that is configured to rub against a part of the discharged fluid. The branched pattern may be formed of at least one protruding pattern having a height smaller than a width of the discharging portion. The branched pattern may be configured to have an inclination angle inclined toward a traveling direction of the fluid. This inclination angle enables the fluid to be circulated to the reduction flow passage located in a downward direction by dividing only a part of the fluid without largely interrupting main flow Y of the fluid.

As such, the branched air Y1~Y3 is discharged through the outlet portion 330 via the second temperature conversion portion 200B or may be circulated again. In this case, particularly, the reduction flow passage 401 may be provided between the housing and the thermoelectric module and may be provided as a separation space having a width that reduces gradually toward a lower part at a position of the discharging portion. More specifically, the reduction flow passage 401 may be implemented such that a movement width of the fluid reduces gradually to an arrangement position of the second temperature conversion portion 200B along an inclination surface of an inner side of the housing 300, so that the fluid can be naturally moved and circulated downwards.

Figure 2:
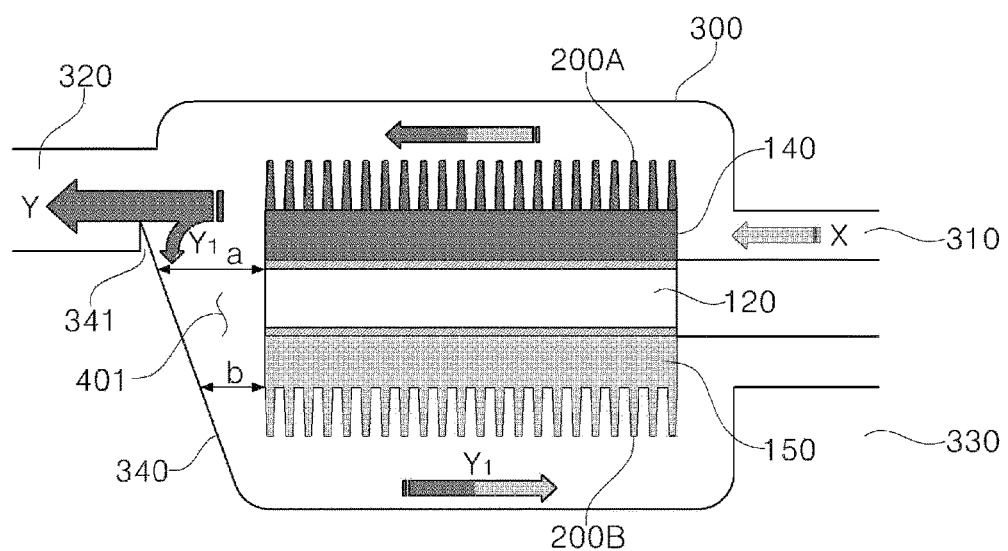
FIG. 2 is a conceptual view illustrating the main portions of a heat conversion device according to the embodiment of the present invention.

In a structure illustrated in FIG. 2, it is exemplified that a separate portion is not provided by simplifying the structure illustrated in FIG. 1, the reduction flow passage 401 is implemented by changing the arrangement structure of the housing and the thermoelectric module, and a part of the discharged air Y is transmitted to the second temperature conversion portion 200B. Since the remaining basic structure and concept except for this are similar to those of the aforesaid structure, they are omitted.

Figure 3:
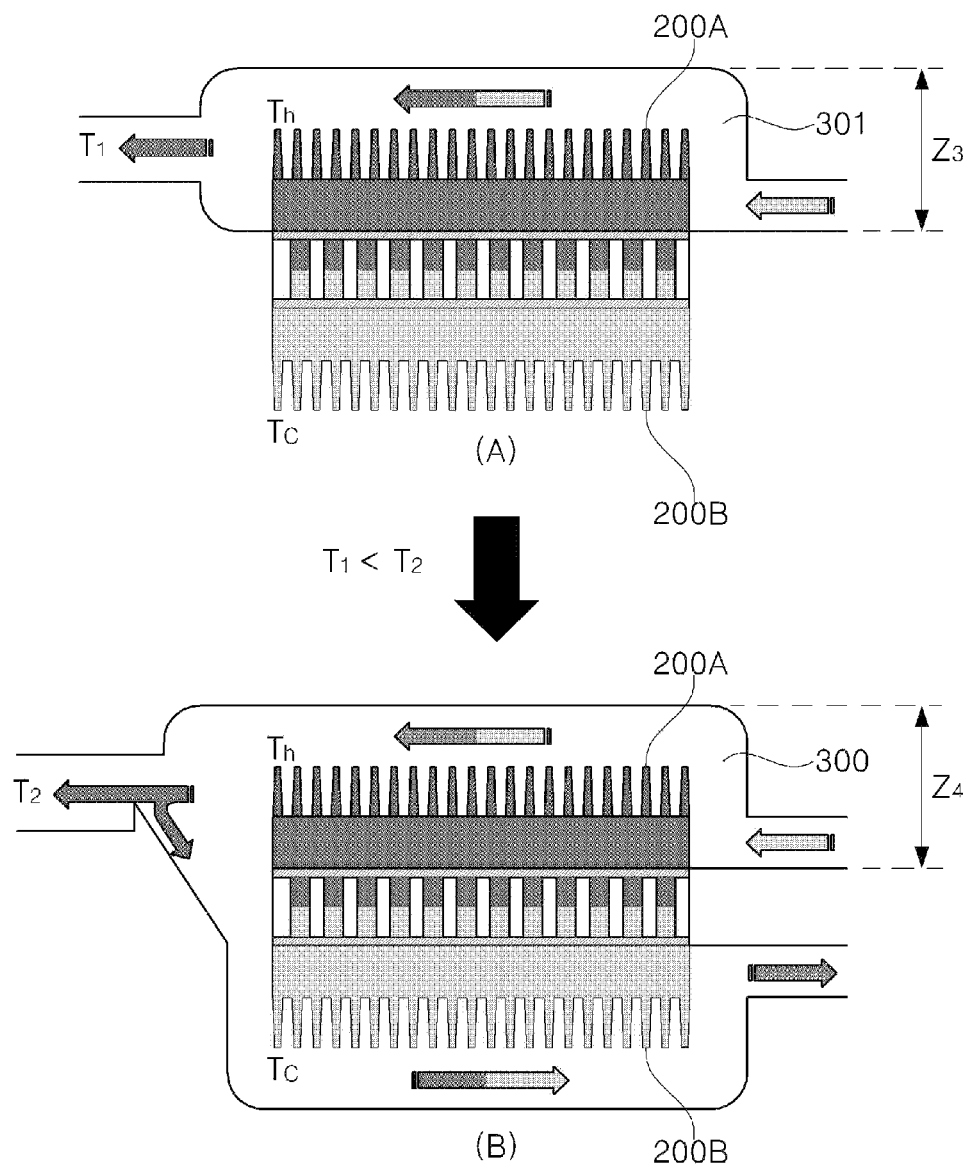
FIGS. 3 and 4 are views illustrating the operational states of a heat conversion device according to the embodiments of the present invention.

FIG. 3 illustrates an example intended for strengthening a heating function with respect to application of the heat conversion device according to the embodiment of the present invention. That is, FIG. 3 illustrates an experimental example in which a maximally increased temperature of the heating portion can be entirely increased by raising a temperature of the cooling portion using a part of air passing through the heating portion with respect to the a temperature $T_h$ of the heating portion and the temperature $T_c$ of the cooling portion, on the assumption that a temperature differential between the heat portion and the cooling portion of the thermoelectric element is fixed. The basic structure of the heat conversion device will be described based on the structure illustrated in FIG. 2.

In the case of A of FIG. 3, when it is assumed that the housing is simply formed at the heat emitting portion, and the heat emitting portion is utilized as a fan heater, a temperature of injected air is set as 23.0° C., a temperature $T_h$ of the heat emitting portion is set as 40.3° C., and a temperature $T_c$ of the heat absorption portion is set as 4.8° C. In such a case, it was measured that a temperature $T_1$ of air discharged through only the first temperature conversion portion 200A is 30.1° C.

In contrast, based on the structure according to the embodiment of the present invention in the same structure, the results of measuring a temperature $T_2$ of air discharged after transmitting a part of the air passing through the first temperature conversion portion 200A to the second temperature conversion portion 200B to increase a temperature of the air are compared with the results captioned above as shown in the following Table.

TABLE 1

| | Temperature of Injected Air | $T_h$ | $T_c$ | Temperature of Discharged Air |
|---|---|---|---|---|
| A | 23.0° C., | 40.3° C., | 4.8° C., | $T_1$: 30.1° C., |
| B | 23.0° C., | 45.7° C., | 9.4° C., | $T_2$: 34.6° C., |

That is, when applying a thermoelectric module having a fixed temperature differential under the same conditions as those of the experimental example above, even in the case of the temperature of injected air (23.0° C.), the temperature $T_h$ of the heat emitting portion is increased by 45.7° C., and the temperature of the heat absorption portion is increased by 9.4° C. That is, through this result, it could be confirmed that the fixed temperature differential ΔT of the thermoelectric element is not changed because the air branched from the first temperature conversion portion 200A corresponding to the heat emitting portion increases the temperature of the heat absorption portion located at the second temperature conversion portion from 4.8° C. to 9.4° C., and that the temperature of the heat emitting portion is entirely increased from 40.3° C. to 45.7° C. Furthermore, it could be confirmed that a warm current of air having a raising temperature to the extent of about 4.5° C. is discharged in light of the fact that the temperature T2 of finally discharged air is 34.6° C.

Figure 4:
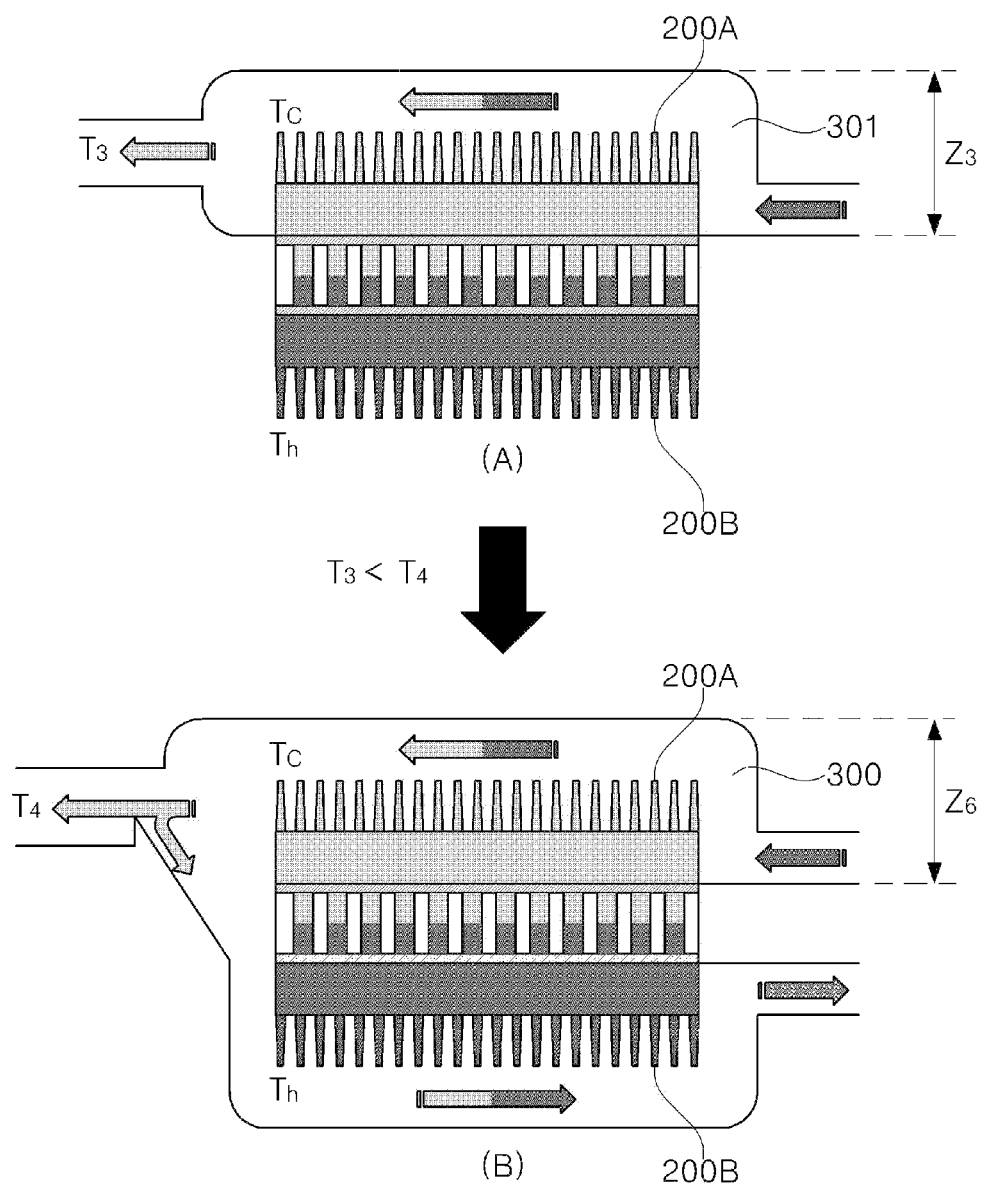

In contrast with the case of FIG. 3, FIG. 4 illustrates a comparative experimental example of the embodiment of the present invention, which shows that the heat conversion device is implemented as a cooling device.

That is, unlike in FIG. 3, the heat conversion device is implemented as a device forming cooling air by disposing the first temperature conversion portion 200A at a lower part and the second temperature conversion portion 200B at an upper part. Accordingly, flowing air is discharged in a state of being cooled by passing through the second temperature conversion portion 200B. When the temperature of the first temperature conversion portion 200A is slightly reduced by branching a part of the cooled air and transmitting the branched air to the lower part, the temperature of the second temperature conversion portion is further reduced by the fixed temperature differential.

TABLE 2

| | Temperature of Injected Air | $T_h$ | $T_c$ | Temperature of Discharged Air |
|---|---|---|---|---|
| A | 23.0° C., | 41.1° C., | 4.3° C., | $T_1$: 13.4° C., |
| B | 23.0° C., | 36.5° C., | 1.2° C., | $T_2$: 9.7° C., |

Referring to Table 2, in the structure illustrated in A of FIG. 4, a temperature T3 of the cooled air passing through only the second temperature conversion portion 200B is a temperature (23.0° C.) of injected air, the temperature $T_h$ of the heat emitting portion is set as 41.1° C., and the temperature $T_c$ of the heat absorption portion is set as 4.3° C. In such a case, it was measured that the temperature $T_3$ of air discharged via only the second temperature conversion portion 200B is 13.4° C. through a cooling process.

In contrast, another example shows that the same thermoelectric element is provided, and in an embodiment of the present invention as the structure illustrated in B of FIG. 4, a part of cooled air passing through the second temperature conversion portion 200B is branched and is guided to the first temperature conversion portion 200A so that the temperature of the heat absorption portion is further reduced. That is, under the same conditions as those of the experimental example above, when the thermoelectric module having the fixed temperature differential is applied, even in the case of the temperature (23.0° C.) of the injected air, the temperature $T_h$ of the heat emitting portion is reduced to 36.5° C., and the temperature of the heat absorption portion is also further reduced to 1.2° C.

That is, as air branched from the cooled air passing through the second temperature conversion portion 200B, which is a heat absorption portion, cools the temperature of the heat emitting portion arranged at the first temperature conversion portion 200A from 41.1° C. to 36.5° C., the fixed temperature differential (ΔT) of the thermoelectric element is not changed. Thus, it could be confirmed that the temperature of the heat absorption portion is further entirely reduced from 4.3° C. to 1.2° C., and a temperature T4 of finally discharged air is 9.7° C. so that it could be confirmed that cold air having a further reduced temperature corresponding to about 3.7 is discharged.

An increase or a reduction of the temperature described above is 3° C.~4° C. However, this may be a supporting basis for the implementation of very remarkably efficiency in consideration of the fact that the fixed temperature differential of the thermoelectric element may be variously changed according to a specification.

One example of another main constitution for the constitution of the heat conversion device according to the embodiment of the present invention will be hereinafter described.

Figure 5:
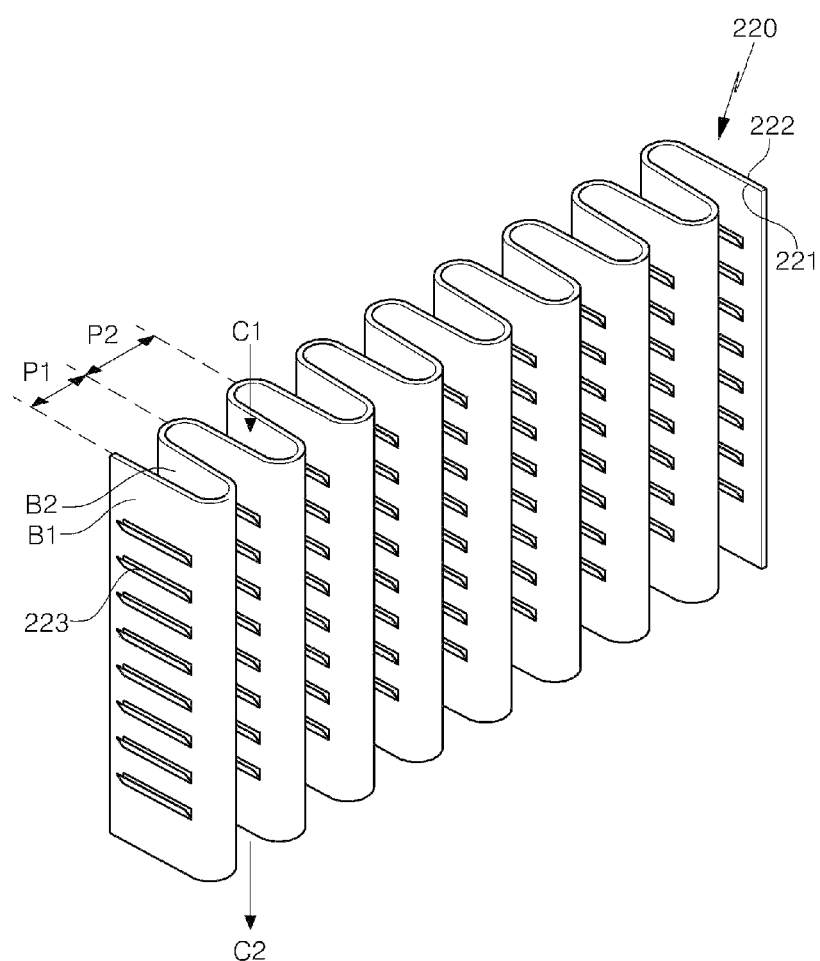
FIGS. 5 and 6 are conceptual views illustrating one example of a heat transfer member according to an embodiment of the present invention.

FIG. 5 is an exemplary view illustrating a structure of a heat transfer member included in the first temperature conversion portion or the second temperature conversion portion according to the embodiment of the present invention of FIGS. 1 to 3.

That is, the first temperature conversion portion or the second temperature conversion portion according to the embodiment of the present invention comes into contact with the substrate of the heat absorption portion or the heat emitting portion in which the thermoelectric element is disposed so that heat emitting or heat absorption performance can be increased. Furthermore, the first temperature conversion portion or the second temperature conversion portion comes into contact with the fluid such as air, a liquid or the like, thereby serving as a structure for implementing a cooling or heating function. Accordingly, in order to efficiently realize the heating function, the first temperature conversion portion or the second temperature conversion portion may be implemented as a heat sink member having a pin-like shape that is configured to widen a surface area. Also, like the structure illustrated in FIGS. 5 and 6, the first temperature conversion portion or the second temperature conversion portion may have a specific structure for widening a contact area with the fluid.

Figure 6:
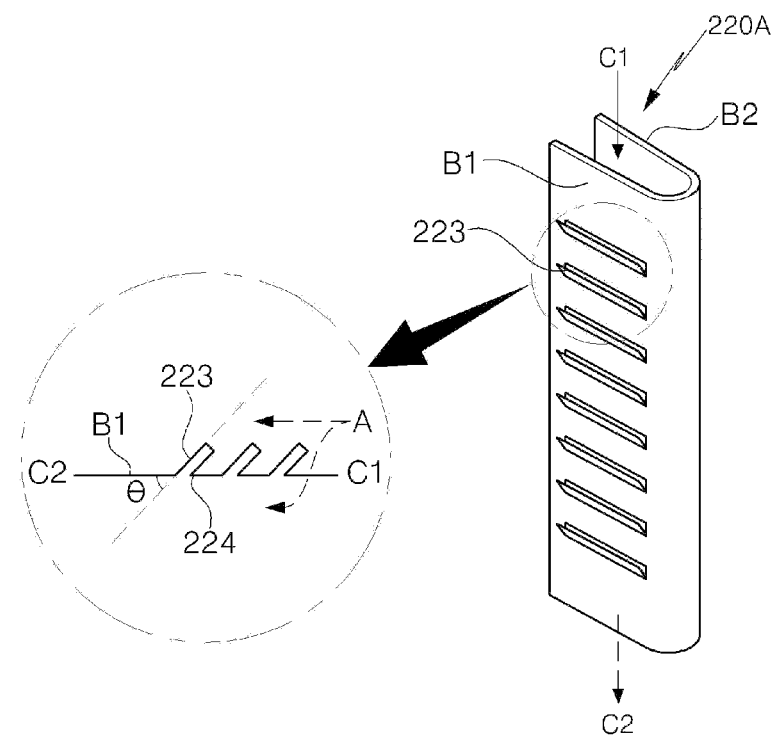

That is, as illustrated in FIGS. 5 and 6, the heat transfer member according to the embodiment of the present invention may be formed such that at least one flow pattern 220A forming an air flow passage C1, which is a certain movement passage of air, is implemented on a plate-shaped substrate of a first flat surface 221 and a second flat surface 222 opposite to the first flat surface 221 so as to perform a surface contact with the fluid such as air or the like.

The flow pattern 220A may be implemented in a folding structure, namely, a structure in which the substrate is folded so that curvature patterns having predetermined pitches P1, P2 and height T1 can be formed. Such a flow pattern may be formed in variously modified forms, as well as the illustrated structure. That is, a first heat transfer member 220 or a second heat transfer member 320 may have two flat surfaces that come into surface contact with air, and may be implemented such that the flow pattern for maximizing a contacting surface area is formed. In the structure illustrated in FIG. 5, when air flows from a direction of the injection portion (C1) in which the air flows, the air may uniformly come into contact with the first flat surface 221 and the second flat surface 222 opposite to the first flat surface 221 and may travel in the direction of an end C2 of the flow passage. Thus, this structure may enable contact with much larger amounts of air in the same space than that of a contact surface with the substrate having a plate-like shape so that a heat absorption effect or a heat emitting effect can be further increased.

In particular, in order to further improve a contact area of the air, the first heat transfer member 220 according to the embodiment of the present invention may include protruding resistance patterns 223 on a surface of the substrate. The resistance pattern 223 may be formed on a first curved surface B1 and a second curved surface B2, respectively in consideration of unit flow patterns.

Furthermore, as shown in the partially enlarged view of FIG. 6, the resistance patterns 223 are formed in protruding structures inclined to have a regular inclination angle θ in a direction in which air enters so that friction with the air can be maximized, thereby enabling an increase in contact area or contact efficiency. Furthermore, grooves 224 are formed on the surface of the substrate at the front of the resistance patterns 223, and thus the air in contact with the resistance patterns 223 passes partially through a front surface and a rear surface of the substrate via the grooves (hereinafter referred to as 'the flow grooves (224)') so that the frequency or area of contact can be increased. Also, in an example illustrated in FIG. 6, the resistance patterns are disposed so that resistance in an air flow direction can be maximized, but the present invention is not limited to such a configuration. According to each resistance design, the protruding resistance patterns may be designed in a direction opposite to the direction of the protruding resistance patterns so that a level of resistance can be adjusted. In FIG. 6, the resistance patterns 223 are formed on an external surface of the heat transfer member, but such a structure of the resistance patterns may be also changed to a structure in which the resistance patterns are formed on an internal surface of the heat transfer member.

FIGS. 7 and 8 exemplify a structure of the thermoelectric module of the present invention described though FIGS. 1 to 3.

Referring to FIGS. 7 and 8, the thermoelectric module including the thermoelectric element according to the embodiment of the present invention may include at least unit cell including the first substrate 140 and the second substrate 150 disposed to face each other, and the first semiconductor element 120 and the second semiconductor element between the first substrate 140 and the second substrate 150, the first and second semiconductor elements being electrically connected to each other. The first substrate 140 and the second substrate 120 may be insulating substrates, for example, alumina substrates. In an alternative embodiment, metal substrates may be used as the first and second substrates so that heat absorption and heat dissipation efficiency and a slimming structure can be implemented. Of course, when the first substrate 140 and the second substrate 150 are metal substrates, as illustrated in FIG. 8, the thermoelectric module may further include dielectric layers 170a, 170b between electrode layers 160a, 160b. The reason for this is because, in the aforesaid structure through FIG. 1, when a third substrate 210A and a fourth substrate 310B of the first module 200 and the second module 300 are integrally formed with the first substrate and the second substrate, a material, such as alumina, Cu, a Cu alloy or the like, may be applied.

Cu or a Cu alloy may be applied to a metal substrate, and a thickness of the metal substrate for enabling implementation of a slimming structure may range from 0.1 to 0.5 mm. When the thickness of the metal substrate is smaller than 0.1 mm or is greater than 0.5 mm, a heat emitting characteristic is excessively increased or thermal conductivity is excessively increased, and as a result, reliability of the thermoelectric module is largely reduced. Also, in consideration of thermal conductivity of the thermoelectric module for cooling, as a dielectric material having high heat emitting performance, a material having a thermal conductivity of 5 to 10 W/K is used in the dielectric layers 170a, 170b, and a thickness of each of the dielectric layers may range from 0.01 to 0.15 mm. When the thickness of the dielectric layer is less than 0.01 mm, insulating efficiency (or a withstand voltage characteristic) is largely reduced, and when the thickness of the dielectric layer is greater than 0.15 mm, thermal conductivity is reduced so that heat dissipation efficiency is reduced. The electrode layers 160a, 160b connect the first semiconductor element and the second semiconductor element using an electrode material, such as Cu, Ag, Ni, or the like. When multiple unit cells are connected, as illustrated in FIG. 8, the electrode layer forms electrical connection with the adjacent unit cell. A thickness of the electrode layer may range from 0.01 to 0.3 mm. When the thickness of the electrode layer is less than 0.01 mm, a function of the electrode layer as an electrode is reduced so that electric conductivity becomes poor. When the thickness of the electrode layer is greater than 0.3 mm, resistance is increased so that transmission efficiency is reduced.

In particular, in this case, the thermoelectric element including unit elements having a layered structure according to the present embodiment of the invention may be applied as the thermoelectric element constituting the unit cells. One side of the thermoelectric element may be composed of a p-type semiconductor as the first semiconductor element 120 and an N-type semiconductor as the second semiconductor element 130, and the first semiconductor and the second semiconductor may be connected to the metal electrodes 160a, 160b. Thus, such a structure is formed in plural numbers, and the Peltier effect is implemented by circuit lines 181, 182 for supplying electric currents to the semiconductor elements via the electrode.

A P-type semiconductor material or an N-type semiconductor material may be applied to the semiconductor elements in the thermoelectric module. With regard to the P-type semiconductor material or the N-type semiconductor material, the N-type semiconductor element may be formed using a mixture in which a main raw material composed of a BiTe-based material including Se, Ni, Al, Cu, Ag, Pb, B, Ga, Te, Bi, and In is mixed with 0.001 to 1.0 wt % of Bi or Te based on a total weight of the main raw material. For example, when the main raw material is a Bi—Se—Te material, 0.001 to 1.0 wt % of Bi or Te based on the total weight of the Bi—Se—Te material may be further added to the Bi—Se—Te material. That is, when the Bi—Se—Te material is injected in an amount of 100 g, Bi or Te, which is additionally mixed with the Bi—Se—Te material, may be added in the amount of 0.001 to 1.0 g. As described above, the weight range of the material added to the main raw material has significance in light of the fact that when the weight range of the material added to the main raw material deviates from the range of 0.001 to 0.1 wt %, heat conductivity is not reduced, but electric conductivity is reduced, so the improvement of a ZT value cannot be expected.

The P-type semiconductor element may be formed using a mixture in which a main raw material composed of a BiTe-based material including Se, Ni, Al, Cu, Ag, Pb, B, Ga, Te, Bi, and In is mixed with 0.001 to 1.0 wt % of Bi or Te based on a total weight of the main raw material. For example, when the main raw material is a Bi—Se—Te material, 0.001 to 1.0 wt % of Bi or Te based on the total weight of the Bi—Se—Te material may be further added to the Bi—Se—Te material. That is, when the Bi—Se—Te material is injected in an amount of 100 g, Bi or Te, which is additionally mixed with the Bi—Se—Te material, may be added in the amount of 0.001 to 1.0 g. As described above, the weight range of the material added to the main raw material has significance in light of the fact that when the weight range of the material added to the main raw material deviates from the range of 0.001 to 0.1 wt %, heat conductivity is not reduced, but electric conductivity is reduced, so the improvement of a ZT value cannot be expected.

The first semiconductor element and the second semiconductor element facing each other while forming the unit cells may have the same shape and size. However, in such a case, an electric conductivity property of the P-type semiconductor element and an electric conductivity property of the N-type semiconductor element are different from each other, and this serves as a factor that reduces cooling efficiency. Thus, in consideration of this fact, any one semiconductor element of the semiconductor elements may be formed to have a different volume from that of the other semiconductor element so that cooling performance can be improved.

That is, the forming the semiconductor elements of unit cells disposed to face each other so as to have different volumes may be implemented in such a manner that entire shapes of the semiconductor elements are differently formed, a cross section of any one of the semiconductor elements having the same height is formed to have a wide diameter, or the semiconductor elements having the same shape are formed to have different heights or different diameters in each cross section. In particular, the N-type semiconductor element is formed to have a larger volume than that of the P-type semiconductor element so that thermoelectric efficiency can be improved.

As such, the heat conversion device according to the embodiment of the present invention may be very commonly applied to various electric home appliances including a washing machine, a dehumidifier, a refrigerator, a cold-air blower, a hot-air blower, and the like, equipment for vehicles, industrial equipment or the like.

As set forth above, according to some embodiment of the present invention, a part of the fluid passing through the heat conversion device using the thermoelectric element is moved to a heat absorption side or a heat emitting side so that a temperature differential ΔT between the heat absorption portion and the heat emitting portion can be maximized, thereby increasing thermoelectric efficiency.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A heat conversion device, comprising:
a housing;
a thermoelectric module received in the housing;
a plurality of portions received in the housing;
a first temperature conversion portion and a second temperature conversion portion received in the housing; and
a fluid received in the housing;
wherein the housing comprises:
an injection portion located at a first distal end of the housing,
an outlet portion located at the first distal end of the housing, and
a discharging portion located at a second distal end of the housing opposite to the first distal end of the housing;
wherein the thermoelectric module comprises:
a second substrate disposed on the second temperature conversion portion,
a thermoelectric semiconductor disposed on the second substrate, and
a first substrate disposed on the thermoelectric semiconductor;
wherein the first temperature conversion portion is disposed on the first substrate,
wherein the plurality of the portions comprises:
a first portion disposed extending from a second distal end of the first substrate to a portion of the second distal end of the housing and in contact with the second distal end of the first substrate and the portion of the second distal end of the housing,
a second portion disposed extending from the first portion to a second distal end of the second substrate and in contact with the first portion and the second distal end of the second substrate,
a third portion disposed extending from a first distal end of the first substrate opposite to the second distal end of the first substrate to a portion of the first distal end of the housing and in contact with the first distal end of the first substrate and the portion of the first distal end of the housing, and a fourth portion disposed extending from a first distal end of the second substrate opposite to the second distal end of the second substrate to a portion of the first distal end of the housing and in contact with the first distal end of the second substrate and the portion of the first distal end of the housing;
wherein the first portion includes communication holes,
wherein the discharging portion includes
a branched pattern portion including a branched pattern at an entrance of the discharging portion of the housing,
wherein the branched pattern is formed to protrude from the entrance of the discharging portion of the housing to reduce a width of the discharging portion,
wherein the branched pattern is formed of at least one protruding pattern having a height smaller than the width of the discharging portion,
wherein the housing and the branched pattern are monolithically formed,
wherein the injection portion receives the fluid from outside of the housing,
wherein the discharging portion is configured to discharge the fluid passing through the injection portion via the first temperature conversion portion,
wherein the communication holes of the first portion are configured to divide the fluid by the branched pattern,
wherein the divided fluid passes the communication holes from a first region formed to communicate with the first temperature conversion portion to a second region formed to communicate with the second temperature conversion portion,
wherein the outlet portion is configured to discharge a part of the fluid passing through the injection portion via the second temperature conversion portion, and
wherein the thermoelectric semiconductor is spaced apart from the fluid by the first substrate, the second substrate, the first portion, the second portion, the third portion, and the fourth portion.

2. The heat conversion device of claim 1, wherein the branched pattern has an inclination angle inclined toward a traveling direction of the fluid.

3. The heat conversion device of claim 1, wherein the reduction flow passage is provided between the housing and the thermoelectric module and is configured to have a width that reduces gradually toward a lower part at a position of the discharging portion.

4. The heat conversion device of claim 1, wherein at least one of the portions has a plate-shaped structure.

5. The heat conversion device of claim 4, wherein at least one of the communication holes adjusts an amount of the fluid flowing in the reduction flow passage.

6. The heat conversion device of claim 1, wherein each of the first temperature conversion portion and the second temperature conversion portion comprises a heat transfer member disposed to be adjacent to the first and second substrates and coming into contact with the fluid.

7. The heat conversion device of claim 6, wherein the heat transfer member comprises: a heat-radiating substrate having a first flat surface in surface contact with the fluid and a second flat surface opposite to the first flat surface; and at least one flow pattern that forms a fluid flow passage in the heat-radiating substrate in a flowing direction of the fluid.

8. The heat conversion device of claim 7, wherein the flow pattern is configured such that a curvature pattern having a fixed pitch in a lengthwise direction of the substrate is implemented.

9. The heat conversion device of claim 8, further comprising resistance patterns protruding from a surface of the heat-radiating substrate on a surface of the flow pattern.

10. The heat conversion device of claim 9, wherein the resistance patterns comprise a plurality of heat-radiating pins protruding in one side direction on the heat-radiating substrate.

* * * * *